(12) United States Patent
Bernasconi et al.

(10) Patent No.: US 9,164,300 B2
(45) Date of Patent: Oct. 20, 2015

(54) RECONFIGURABLE OPTICAL NETWORKS

(71) Applicant: Alcatel-Lucent USA Inc., Murray Hill, NJ (US)

(72) Inventors: Pietro Bernasconi, Genestrerio (CH); Po Dong, Murray Hill, NJ (US); David T. Neilson, Murray Hill, NJ (US); Young-Kai Chen, Murray Hill, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 307 days.

(21) Appl. No.: 13/800,403

(22) Filed: Mar. 13, 2013

(65) Prior Publication Data

US 2014/0003760 A1    Jan. 2, 2014

Related U.S. Application Data

(60) Provisional application No. 61/667,380, filed on Jul. 2, 2012, provisional application No. 61/667,374, filed on Jul. 2, 2012.

(51) Int. Cl.
| | |
|---|---|
| *G02B 6/36* | (2006.01) |
| *G02F 1/01* | (2006.01) |
| *H05K 13/04* | (2006.01) |
| *G02B 6/293* | (2006.01) |
| *G02F 2/00* | (2006.01) |
| *G02B 6/43* | (2006.01) |

(Continued)

(52) U.S. Cl.
CPC ............... *G02F 1/011* (2013.01); *G02B 6/293* (2013.01); *G02B 6/29338* (2013.01); *G02B 6/43* (2013.01); *G02F 2/004* (2013.01); *H04J 14/0212* (2013.01); *H05K 13/04* (2013.01); *G02F 2002/008* (2013.01); *H04Q 2011/0032* (2013.01); *H04Q 2011/0039* (2013.01); *H04Q 2011/0058* (2013.01); *Y10T 29/49002* (2015.01)

(58) Field of Classification Search
None
See application file for complete search history.

(56) References Cited

U.S. PATENT DOCUMENTS

| | | |
|---|---|---|
| 6,115,517 A | 9/2000 | Shiragaki et al. |
| 6,195,187 B1 | 2/2001 | Soref et al. |
| 7,313,329 B2 | 12/2007 | Yoo et al. |

(Continued)

FOREIGN PATENT DOCUMENTS

| | | |
|---|---|---|
| KR | 20100135791 A | 12/2010 |
| WO | 2005067031 A1 | 7/2005 |
| WO | 2005106551 A1 | 11/2005 |

OTHER PUBLICATIONS

Dong, P., et al., "Wavelength-Tunable Silicon Microring Modulator," Optics Express, Optical Soceity of America, vol. 18, No. 11, May 24, 2010, pp. 10941-10946.

(Continued)

*Primary Examiner* — Mike Stahl
(74) *Attorney, Agent, or Firm* — Hitt Gaines, PC

(57) ABSTRACT

A system, e.g. a reconfigurable electro-optical network, includes input and output waveguides. The input waveguide is configured to receive a first input optical signal including a first modulated input wavelength channel. The output waveguide is configured to receive a carrier signal including an unmodulated output wavelength channel. An input microcavity resonator is configured to derive a modulated electrical control signal from the modulated input wavelength channel. A first output microcavity resonator is configured to modulate the output wavelength channel in response to the control signal.

16 Claims, 6 Drawing Sheets

(51) Int. Cl.
*H04J 14/02* (2006.01)
*H04Q 11/00* (2006.01)

(56) References Cited

U.S. PATENT DOCUMENTS

| | | |
|---|---|---|
| 7,421,168 B1 | 9/2008 | Goutzoulis |
| 7,539,418 B1 | 5/2009 | Krishnamoorthy et al. |
| 8,027,587 B1 | 9/2011 | Watts |
| 8,588,556 B1 | 11/2013 | Dong |
| 8,625,936 B1 | 1/2014 | Dong |
| 2002/0159686 A1 | 10/2002 | Madsen |
| 2004/0091198 A1 | 5/2004 | Graves |
| 2005/0053319 A1* | 3/2005 | Doan ............................ 385/14 |
| 2005/0053375 A1 | 3/2005 | Yoo et al. |
| 2006/0008272 A1 | 1/2006 | Abeles |
| 2007/0172235 A1* | 7/2007 | Snider et al. .................... 398/45 |
| 2007/0280577 A1 | 12/2007 | Lu |
| 2008/0193133 A1 | 8/2008 | Krug et al. |
| 2009/0161113 A1 | 6/2009 | Chen |
| 2009/0185803 A1 | 7/2009 | Uemura et al. |
| 2010/0098372 A1 | 4/2010 | Manipatruni et al. |
| 2010/0142973 A1 | 6/2010 | Gubenko et al. |
| 2010/0166424 A1 | 7/2010 | Nagarajan et al. |
| 2010/0226657 A1 | 9/2010 | Raymond et al. |
| 2011/0069963 A1 | 3/2011 | McLaren et al. |
| 2011/0310917 A1 | 12/2011 | Krishnamoorthy et al. |
| 2012/0045163 A1 | 2/2012 | Wu et al. |
| 2012/0057866 A1 | 3/2012 | McLaren et al. |
| 2012/0146646 A1 | 6/2012 | Manipatruni et al. |
| 2012/0177060 A1 | 7/2012 | Lipson et al. |
| 2012/0251042 A1 | 10/2012 | Julien et al. |
| 2012/0251107 A1 | 10/2012 | Krug et al. |
| 2013/0011139 A1 | 1/2013 | Hardy et al. |
| 2014/0003760 A1 | 1/2014 | Bernasconi et al. |
| 2014/0003761 A1 | 1/2014 | Dong |
| 2014/0003810 A1 | 1/2014 | Dong et al. |
| 2014/0270621 A1* | 9/2014 | Dutt et al. ....................... 385/11 |
| 2015/0071632 A1* | 3/2015 | Koka et al. ...................... 398/45 |

OTHER PUBLICATIONS

Dong, P., et al., "Experimental Demonstration of Microring Quadrature Phase-Shift Keying Modulators," Optics Letters, Optical Society, USA, vol. 37, No. 7, Apr. 1, 2012, pp. 1178-1180.

Lu, Y., et al., "All-Optical Format Conversions from NRZ to BPSK and QPSK Based on Nonlinear Responses in Silicon Microring Resonators," Optics Express, Optical Society of America, vol. 15, No. 21, Oct. 17, 2007, pp. 14275-14282.

Foreign Communication From a Related Counterpart Application, PCT Application No. PCT/US2013/047454, International Search Report and Written Opinion dated Oct. 16, 2013, 10 pages.

Foreign Communication From a Related Counterpart Application, PCT Application No. PCT/US2013/047455, International Search Report and Written Opinion dated Oct. 16, 2013, 10 pages.

Foreign Communication From a Related Counterpart Application, PCT Application No. PCT/US2013/048184, International Search Report and Written Opinion dated Oct. 9, 2013, 10 pages.

* cited by examiner

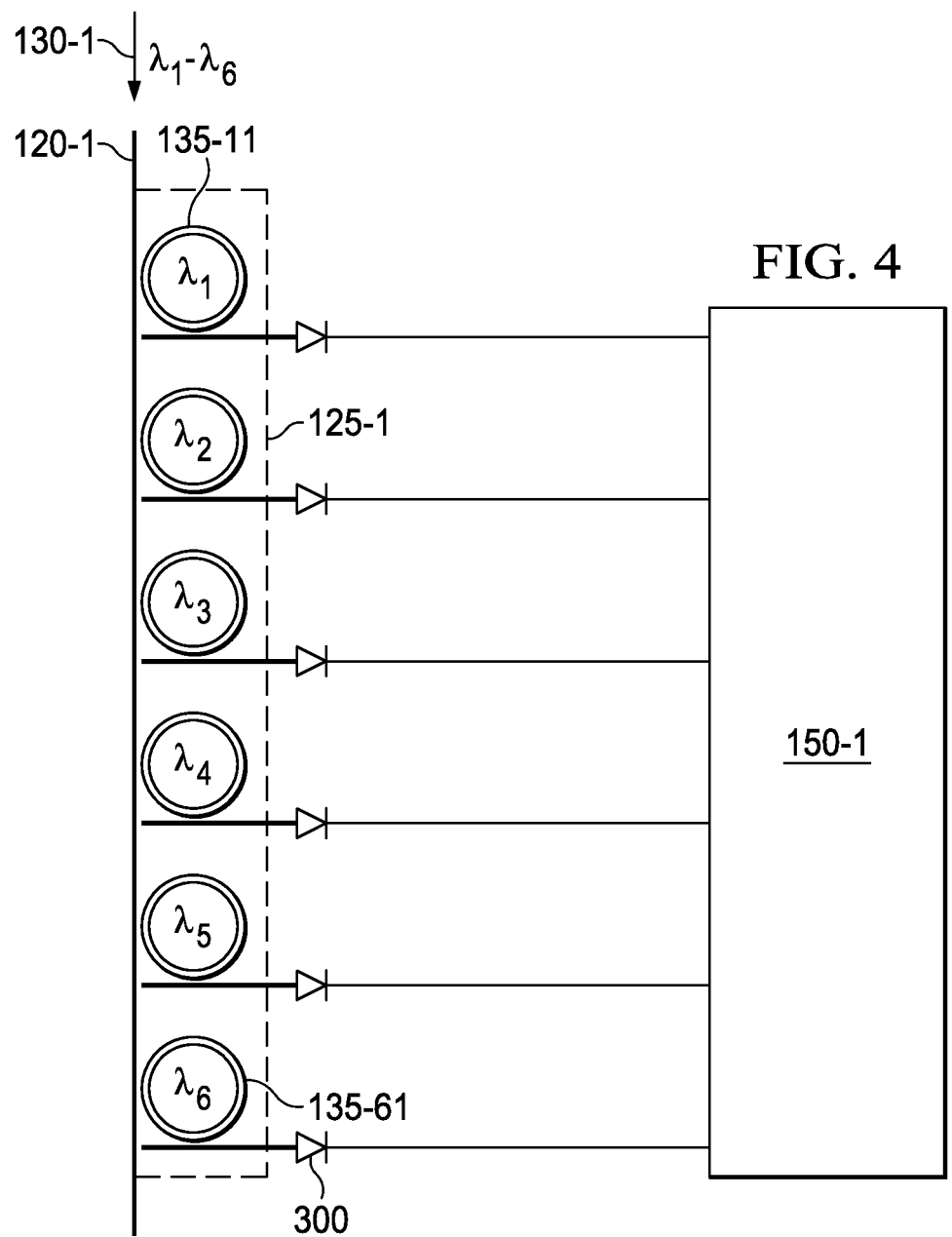

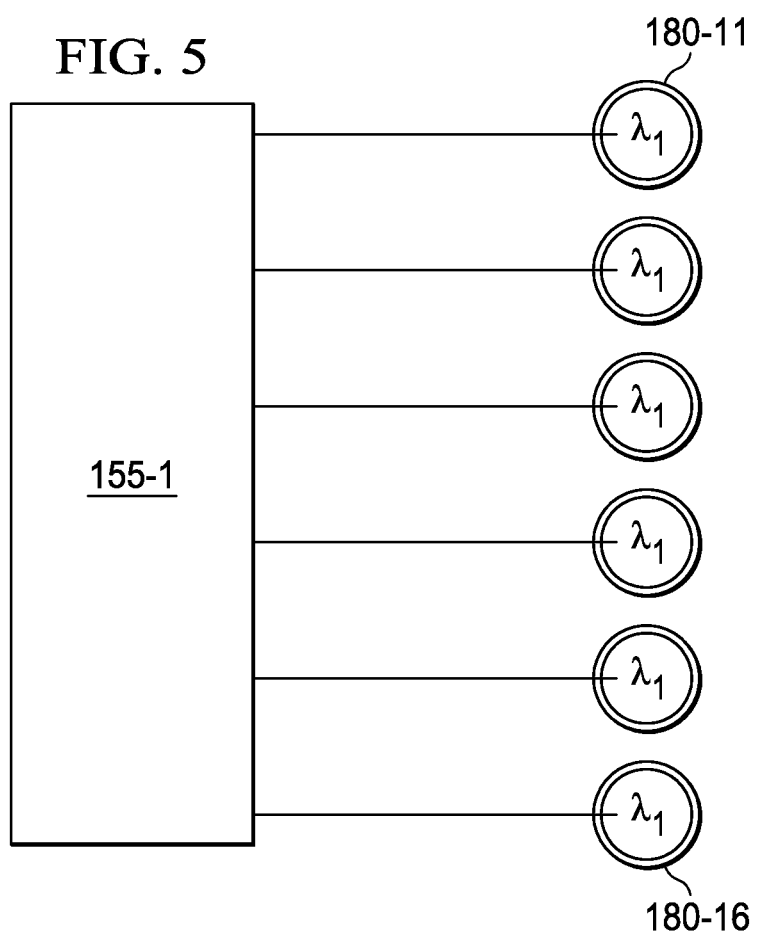

RECONFIGURABLE OPTICAL NETWORKS

CROSS REFERENCE TO RELATED APPLICATIONS

This application is related to U.S. patent application Ser. No. 13/538,525 (the '525 Application) filed on Jun. 29, 2012 and incorporated by reference herein. This application is further related to U.S. patent application Ser. No. 13/800,634 (the '634 Application) filed on even date herewith and incorporated by reference herein. The present application claims the benefit to the previously filed U.S. Provisional Patent Application No. 61/667,380 of the same title, filed Jul. 2, 2012, and which is incorporated herein by reference in its entirety. The present application further claims the benefit to the previously filed U.S. Provisional Patent Application No. 61/667,374 also of the same title, filed Jul. 2, 2012 (the '374 Application), and which is incorporated herein by reference in its entirety.

TECHNICAL FIELD

This application is directed, in general, to optical communications systems and methods.

BACKGROUND

This section introduces aspects that may be helpful to facilitating a better understanding of the inventions. Accordingly, the statements of this section are to be read in this light and are not to be understood as admissions about what is in the prior art or what is not in the prior art.

Optical switching networks employ a switching topology that may be referred to as an "optical switch fabric." As the size and speed of such networks grows, new optical switch fabrics that provide greater capability are needed to keep pace with such growth. One aspect of capability to be addressed is configuration of such optical networks.

SUMMARY

One aspect provides a system, e.g. a reconfigurable electro-optical network, including first input and first output waveguides. The input waveguide is configured to receive a first input optical signal. The signal includes a first modulated input wavelength channel. The output waveguide is configured to receive a carrier signal including an unmodulated output wavelength channel. A first input microcavity resonator is configured to derive a modulated electrical control signal from the modulated input wavelength channel. A first output microcavity resonator is configured to modulate the output wavelength channel in response to the control signal.

Another aspect provides a method, e.g. for forming a reconfigurable electro-optical network. The method includes forming a first input waveguide capable of receiving a first input optical signal, the signal including a first modulated input wavelength channel. A first output waveguide is formed that is capable of receiving a carrier signal, the carrier signal including an unmodulated output wavelength channel. A first input microcavity resonator is formed that is configured to derive a modulated electrical control signal from the modulated input wavelength channel. A first output microcavity resonator is formed that is configured to modulate the output wavelength channel in response to the control signal.

In some of the above embodiments the first input microcavity resonator may be one of a plurality of input microcavity resonators configured to derive an electrical control signal from each one of a corresponding plurality of modulated input wavelength channels. The first output microcavity resonator may be one of a plurality of output microcavity resonators each configured to modulate a corresponding output wavelength channel in response to a corresponding one of the control signals. A controller is configured to reconfigure connectivity between the input microcavity resonators and the output microcavity resonators.

In any of the above embodiments the controller may include a cross-connect switch having N inputs and N outputs, and configured to provide a plurality of unique combinations of signal paths of the control signals between the input microcavity resonators and the output microcavity resonators. In some such embodiments the cross-connect switch has N outputs, and includes a plurality of sub-switches each being configured to switch $\sqrt{N}$ inputs to $\sqrt{N}$ outputs. In some embodiments the cross-connect switch provides N! unique combinations of signal paths.

In any of the above embodiments the input and output waveguides may be located on a first substrate and the controller may be located on a second substrate. In some such embodiments the first and second substrates are may both be bonded to an interposed interconnect substrate.

In any of the above-described embodiments the microcavity resonators may comprise ring resonators. In any of the above-described embodiments the input wavelength channel and the output wavelength channel may each employ a same wavelength. In any of the above-described embodiments the system may include an optical source configured to produce the carrier signal. In such embodiments the optical source may be configured to produce a plurality of wavelength components in the optical S, C, or L bands.

Another embodiment is a system comprising an NM×NM electrical cross-connect, N first sets and N second sets. Of the N first sets, each first set including M ring resonators optically coupled to an optical waveguide corresponding to the same first set, each ring resonator of the first sets having an optical-to-electrical output connected to a corresponding electrical input of the NM×NM electrical cross-connect. Of the N second sets, each second set includes M ring resonators optically coupled to an optical waveguide corresponding to the same second set, each ring resonator of the second sets having an optical-to-electrical input connected to a corresponding output of the NM×NM electrical cross-connect.

Some such embodiments further comprise N optical transmitters capable of transmitting on M optical transmission channels, each transmitter optically coupled to a corresponding one of the optical waveguides optically coupled to one of the first sets. Some such embodiments further comprise N optical receivers capable of receiving on M optical reception channels, each receiver optically coupled to a corresponding one of the optical waveguides optically coupled to one of the second sets. In any such embodiments, the electrical cross-connect may be configured to connect each ring resonator of a same one of the first sets to a different one of the second sets. In any such embodiments, the electrical cross-connect may be configured to connect each ring resonator of one of the first sets to a different one of the second sets. In any such embodiments, the electrical cross-connect may be configured to connect each ring resonator of one of the second sets to a different one of the first sets. In any such embodiments, the electrical cross-connect is configured to connect each ring resonator of one of the second sets to a different one of the first sets. In any such embodiments, the NM×NM electrical cross-connect may be dynamically reconfigurable.

BRIEF DESCRIPTION

Reference is now made to the following descriptions taken in conjunction with the accompanying drawings, in which.

Figure 1:
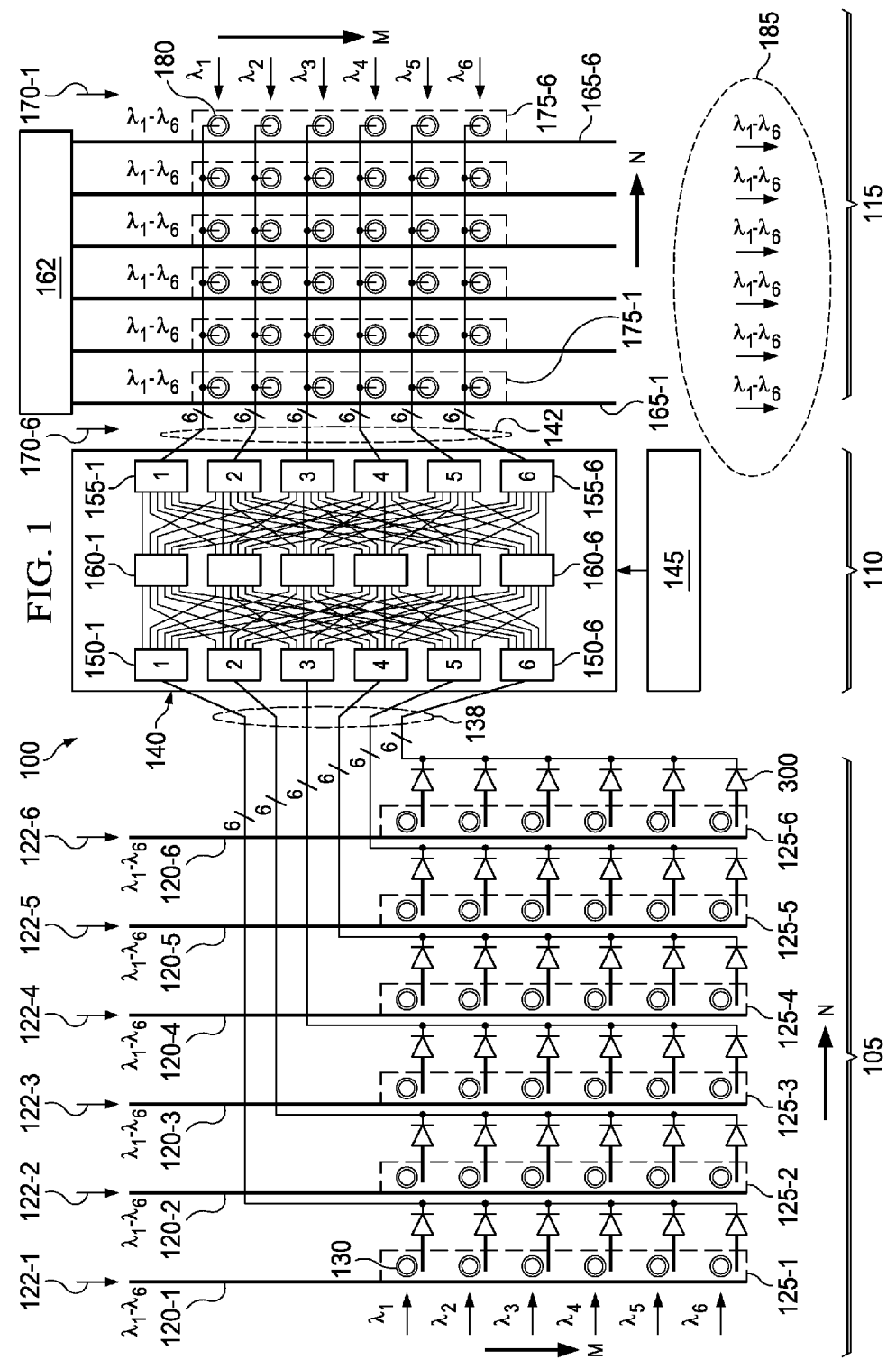
FIG. 1 illustrates a system, e.g. a reconfigurable electro-optical switching matrix, according to one embodiment in which electrical data signals produced from data-modulated optical carriers are routed by a reconfigurable electrical switch to a plurality of output microcavity resonators (e.g. ring resonators) to data-modulate wavelength channels of output optical signals.
Figure 2:
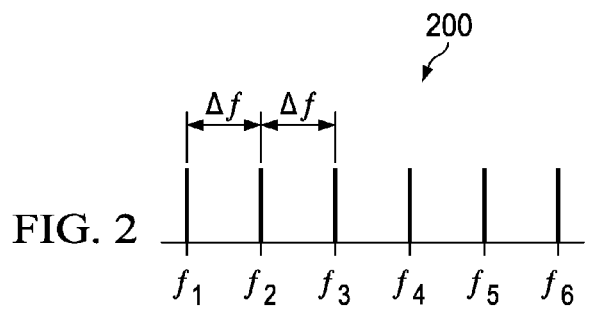
Figure 3:
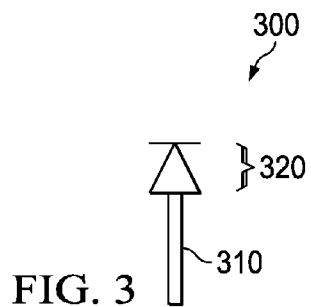
Figure 6A:
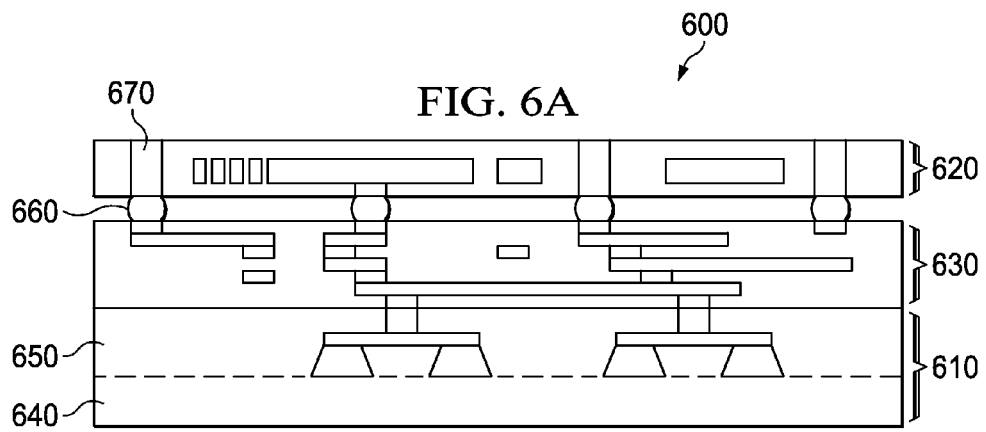
Figure 6B:
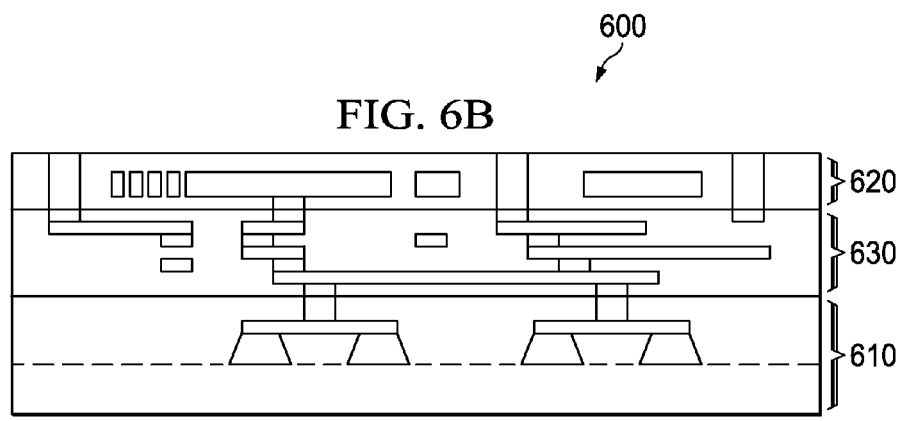
Figure 6C:
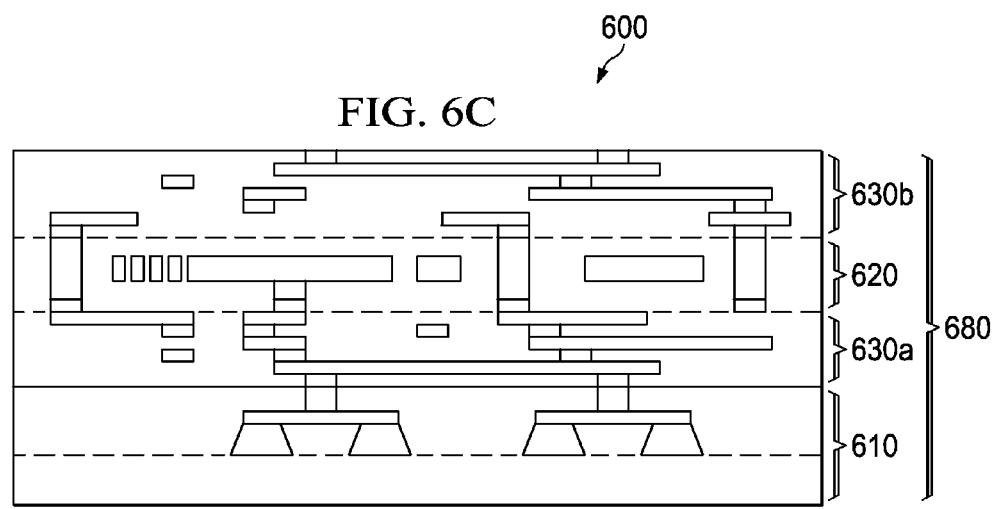
Figure 7:
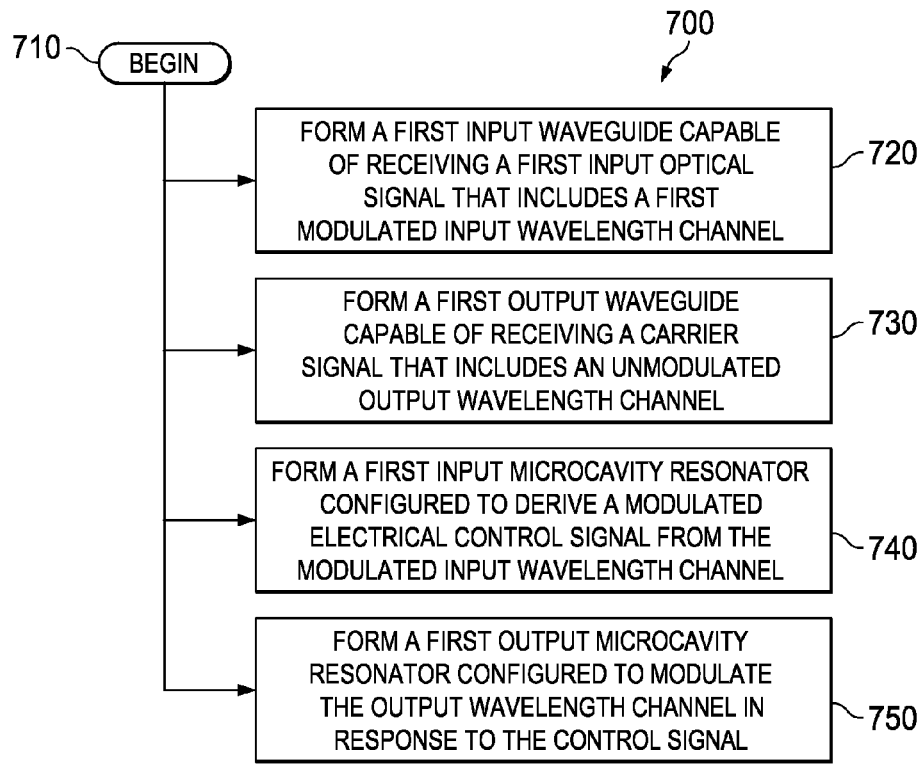
Figure 8:
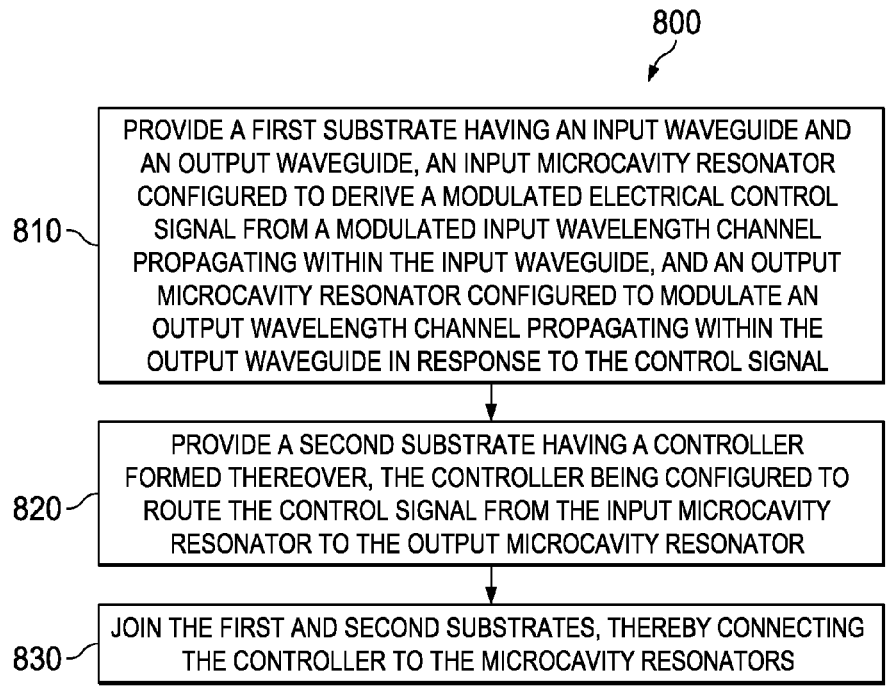

FIG. 2 schematically illustrates aspects of a wavelength comb including a number of wavelength channels of a WDM optical signal;

FIG. 3 illustrates an optical-to-electric converter used in various embodiments to convert an optical signal, e.g. a binary phase-shift keyed (BPSK) optical signal, to a corresponding electrical signal;

FIG. 4 illustrates a detail view of the system of FIG. 1 for signal conversion and routing of one received WDM optical signal to an input sub-switch of the reconfigurable electrical switch;

FIG. 5 illustrates a detail view of the system of FIG. 1 for signal routing and conversion from one output of the reconfigurable electrical switch of FIG. 1 to microcavity resonators configured to modulate output optical wavelength channels;

FIGS. 6A-6C illustrate cross-sectional views of planar structures that may be used to produce various embodiments of components of the system of FIG. 1;

FIG. 7 presents a flow diagram of a method, e.g. for forming a system according to various embodiments, e.g. the system of FIG. 1; and FIG. 8 presents a flow diagram of a method, e.g. for forming a system according to various embodiments, e.g. the system of FIG. 1.

DETAILED DESCRIPTION

The inventors have determined that a compact and flexible architecture for switching data between optical WDM (wavelength-division multiplexed) channels in an optical network may be implemented using microcavity resonators coupled to input waveguides to convert received data-modulated optical signal streams to corresponding data-modulated electrical signal streams, and electrically switching the data-modulated electrical signal streams to a plurality of microcavity resonators, which re-convert the individual data-modulated electrical signals into output data-modulated optical carriers.

Some structures and/or methods described in the '374 Application and/or the '249 Application may be suitable for making or using similar structures and/or methods of the present application.

FIG. 1 presents a system 100, e.g. an embodiment of an M×N reconfigurable optical network 100 in one nonlimiting example. The parameter M describes a number of wavelength channels in a wavelength division multiplexed (WDM) optical signal that may be received by the system 100 on each of N WDM modulated optical signals. The system 100 is illustrated without limitation with M=N=6. Those skilled in the pertinent art will appreciate that the principles of the disclosed embodiments are adaptable to different values of M and N, and that M and N need not be equal.

The system 100 includes three sections that are described in turn, a receiver stage 105 that which performs optical-to-electrical conversion, an electrical switching stage 110, and a transmitter stage 115 that performs electrical-to-optical conversion.

The receiver stage 105 includes a plurality of input waveguides 120-1 . . . 120-6, collectively referred to as input waveguides 120. Each waveguide 120-1 . . . 120-6 may receive a WDM optical signal 122-1 . . . 122-6, including as many as M (e.g. 6) data-modulated wavelength channels.

Each of the multi-channel optical signals 122 may be coupled to the system 100 via, e.g. grating couplers. As appreciated by those skilled in the optical arts, a WDM signal may be schematically described by a frequency or wavelength comb. FIG. 2 illustrates a representative wavelength comb 200 that includes six wavelength channels $\lambda_1 \ldots \lambda_6$. The wavelength channel components of the comb 200 may be spaced by a WDM grid spacing $\Delta\lambda$, e.g. a regular, about even spacing of the wavelength components by a same frequency difference, e.g. about 100 GHz.

The receiver stage 105 further includes a plurality of input microcavity resonator sets 125-1 . . . 125-N (e.g. N=6), each including M microcavity resonators 130 (e.g. M=6). Each microcavity resonator 130 may be, e.g. a ring resonator (microring) or a disk resonator (microdisk) configured to couple to a particular wavelength channel of an optical signal 122 propagating in an adjacent waveguide 120. The resonant wavelength is not limited to any particular value, and may be selected to be in any wavelength band used in optical communications, e.g. in the S band (1460 nm-1530 nm), the C band (1530 nm-1565 nm) or the L band (1565 nm-1625 nm), e.g., by adjusting the refractive index of the individual microcavity resonator.

In the remaining discussion, the microcavity resonators 130 are described as ring resonators without limitation thereto. The microcavity resonator sets 125 may therefore also be referred to as ring resonators sets 125. An individual ring resonator may be designated "130-MN", where the integers M and N are replaced by that resonator's assignment to a particular one of the M wavelength channels and a particular one of the N received input signals. Moreover, an optical signal may be described by its frequency or equivalently by its wavelength $\lambda_M$. Each ring resonator set 125 is optically coupled to a corresponding one of the input waveguides 120.

An individual one of the ring resonators 130 in each set 125 is configured to couple to a corresponding one of the wavelength channels of the received multi-channel optical signal. Each ring resonator 130 has a resonant wavelength, which is determined in part by its optical path length and is the wavelength at which optical power couples resonantly from the associated input waveguide 120 to that ring resonator 130. In some or all of the ring resonators 130 adjustment of the resonant wavelength may be performed, e.g. by a heater, which can adjust the effective refractive index of a corresponding one of the ring resonators 130. Thus, e.g., the ring resonators 130-11, 130-12 . . . 130-16 are configured to couple to the $\lambda_1$ wavelength channel, the ring resonators 130-21, 130-22 . . . 130-26 are configured to couple to the $\lambda_2$ wavelength channel, etc.

An optical-to-electrical (OE) converter 300 is located adjacent each ring resonator 130. One such OE converter 300 is illustrated in FIG. 3. The OE converter 300 includes a waveguide segment 310 and a photodiode 320. The photodiode 320 converts optical power propagating within the waveguide segment 310 to an electrical signal. When a particular wavelength channel couples to a particular ring resonator 130, the optical power within the ring is also coupled to the associated waveguide segment 310. Thus the OE converter 300 transfers the received optical signal to the electrical domain. Collectively, the M×N instances of the OE converter 300 may produce up to M×N data-modulated electrical signals 138 (FIG. 1) from the received M×N separate data-modulated optical carriers, i.e., 36 in the present example embodiment.

Returning to FIG. 1, the electrical switching stage 110 includes an M×N by M×N electrical cross-connect switch 140 (e.g., a NM×NM electrical cross-connect) that receives the M×N electrical signals at its inputs and routes each signal to a single corresponding one of its M×N outputs under control of a controller 145. In particular, the electrical cross-connect switch 140 is configured to direct one of the converted electrical signal streams from each OE converter set 125-1 to 125-N to each of the electrical-to-optical (EO) converter sets 175-1 to 175-M. The mapping of the data-modulated electrical signal streams 138 from the inputs to the outputs of the switch 140 may be selectively changed by the operation of the controller 145 is discussed further below.

The implementation of the switch 140 is not limited to any particular form. In the illustrated example embodiment, the switch 140 is "square", meaning the number of inputs is equal to the number of outputs, and the number is a squared integer, e.g. M×N=36, where M=N=6. In such embodiments, the switch 140 may be efficiently implemented using about $\sqrt{N}$ input sub-switches 150-1 . . . 150-6, about $\sqrt{N}$ output sub-switches 155-1 . . . 155-6, and about $\sqrt{N}$ intermediate sub-switches 160-1 . . . 160-6. Alternatively and without limitation, the switch 140 may be implemented directly as an $N^2 \times N^2$ (e.g. 36×36) switch. In some embodiments M≠N, such as when the number of wavelength channels of the received optical signals 122 is not equal to the number of optical signals 122 received.

FIG. 4 illustrates more specifically the connections between one microcavity resonator set, e.g. the set 125-1, and the inputs of a sub-switch 150, e.g. the sub-switch 150-1. The output of each OE converter 300, e.g. one of the electrical signals 138, is connected via an individual electrical path to a corresponding input of the sub-switch 150-1. The illustrated embodiment is but one possible interconnection between the OE converters 300 and the sub-switch 150-1. Because the switch 140 may arbitrarily map inputs to outputs, the signals 138 may be presented in any order to the switch 140.

Referring again to FIG. 1, the transmitter stage 115 includes an optical source 162 and M optical waveguides 165, e.g. M=6. The optical source 162 produces M continuous wave (CW) optical signals 170-1 to 170-M having N wavelength component channels, e.g. as illustrated by the unmodulated frequency comb such as described in FIG. 2. The optical source 162 may include various components, e.g. multi-wavelength-channel laser sources and optical power splitters. The wavelength component channels may have the same wavelengths as those of the received optical signals 122, but are not limited thereto. The waveguides 165 receive the optical signals 170 having N wavelength channels, e.g. N=6.

A corresponding microcavity resonator set 175-1 to 175-M is optically coupled to and located adjacent to a segment of a corresponding one of the waveguides 165 and includes N microcavity resonators 180. The resonators 180 may also be designated by M and N, e.g. 180-MN. Each microcavity resonator 180 within each set 175 is configured to couple to one of the wavelength channels of the CW signal 170 propagating within that waveguide 165. Thus, for the illustrated example, one microcavity resonator 180 in each set 175 may be configured to have a resonant frequency at each of about $\lambda_1$, $\lambda_2$, $\lambda_3$, $\lambda_4$, $\lambda_5$, and $\lambda_6$. Some or all of the microcavity resonators may include a tuning heater that sets the resonant optical wavelength therein.

The resonant optical wavelength of each ring resonator 180 is also modulated by one of M×N electrical data-modulated electrical signal streams 142 from the cross-connect switch 140. A subset of N of the data-modulated signal streams 138 from one the sub-switch 155 controls a corresponding one of each of the resonator sets 175, the corresponding ones being configured to couple to a single one of the wavelength channels. For example, the sub-switch 155-1 provides N signals (e.g. N=6 in FIG. 1), each signal being configured to control the ring resonator 180 in each set 175 that is configured to modulate $\lambda_1$. From another viewpoint, a subset of M of the data-modulated signal streams 142 from the switch 140 controls the ring resonators in a corresponding set 175, the set 175 including M ring resonators 180 corresponding to $\lambda_1$, $\lambda_2$, . . . $\lambda_M$, e.g. M=6. The remaining signals 142 from the switch 140 are configured analogously to modulate the remaining wavelength channels in the optical waveguides 165-1 to 165-M.

FIG. 5 illustrates more specifically the connections between a sub-switch 155, e.g. the sub-switch 155-1, and a row of the ring resonators 180, e.g. those corresponding to the $\lambda_1$ wavelength channels. The respective outputs of the sub-switch 155-1 are each routed to a single one of the ring resonators 180. However, as before the switch 140 may arbitrarily map the inputs to outputs, so the wavelength channel data may be connected in any order to the ring resonators 180.

Referring again to FIG. 1, modulation of the ring resonators 180 may be by, e.g. electro-optic, thermal or free-carrier modulation of the optical patch length. The modulation data-modulates the coupled wavelength channel of the carrier signal propagating in the corresponding waveguide 165. Additional aspects of such modulation are described in the '525 Application. By modulating the resonant frequencies of each of the ring resonators 180, the system 100 produces output optical signal streams 185. The system 100 may thereby transfer the data received on each one of the wavelength channels of the input signals 122 to a selected corresponding one wavelength channel of a corresponding one of the output signals 185.

Thus the system 100 is expected to provide a high-speed and flexible architecture for configuring an optical switch fabric of an optical communication system. The system 100 may be used in many types of optical systems. In one example, the system may be used to route optical signals within an integrated photonic optical processor. In another example, the system 100 may provide quasi-static or dynamic reconfiguration of optical paths in a communication system, e.g. a long-haul optical communication system. The system 100 may also be used to enable machine-to-machine optical communications in a data center.

Figure 1A:
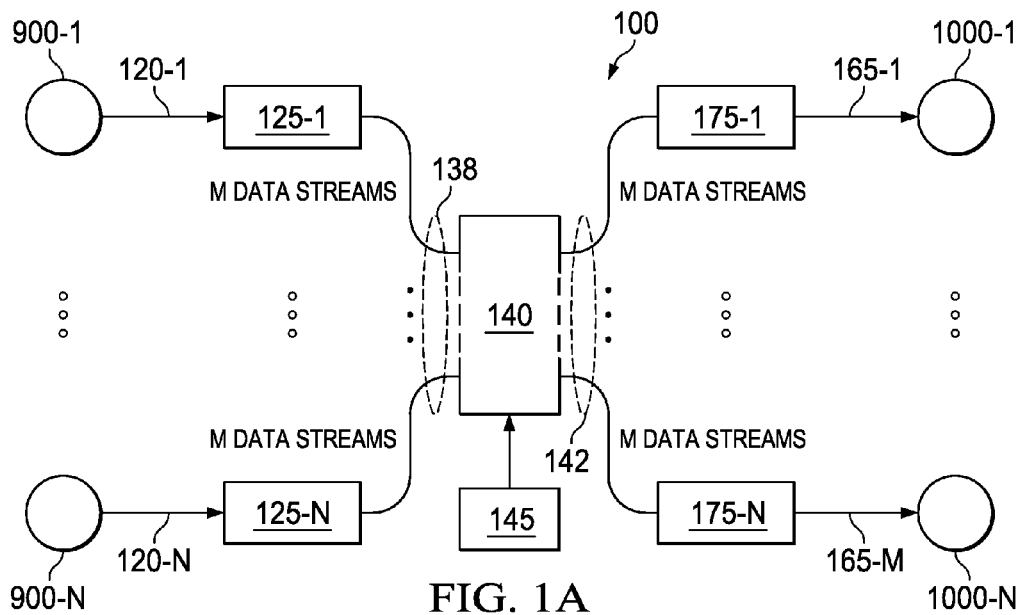
FIG. 1A is a block diagram illustrating how the system of FIG. 1 may be used to implement an optical communication system between N electronic devices that transmit data-modulated optical carriers and N electronic devices, which receive data-modulated optical carriers.

FIG. 1A illustrates how the system 100 enables machine-to-machine communications between a set of N machines 900-1 to 900-N, which output optical data-modulated carriers, and a set of N machines 1000-1 to 1000-N, which receive and process data-modulated optical carriers. Each machine 900-1 to 900-N connects via a corresponding optical fiber 120-1 to 120-N to a corresponding microcavity resonator set 125-1 to 125-N. Each machine 1000-1 to 1000-N connects via a corresponding optical fiber 165-1 to 165-N to a corresponding microcavity resonator set 175-1 to 175-N.

In the system 100, each machine 900-1 to 900-N has an optical transmitter capable of outputting data-modulated optical carriers in M wavelength channels.

In the system 100, each machine 1000-1 to 1000-M has an optical receiver capable of inputting and processing data-modulated optical carriers in M wavelength channels.

In one embodiment, the system 100 is a data center with N digital data processors 900-1 to 900-N and N digital data storage devices 1000-1 to 1000-N. In other embodiments, the devices 900-1 to 900-N may be different types of devices capable transmitting data-modulated optical carriers in M wavelength channels. In other embodiments, the devices 1000-1 to 1000-N may be different types of devices capable receiving and processing data-modulated optical carriers in M wavelength channels. The wavelengths of the M wavelength channels of the machines 900-1 to 900-N may be, but need not be, the same as the M wavelength channels of the machines 1000-1 to 1000-N.

In some such embodiments, the system 100 enables each of the N digital data processors to communicate a separate digital data stream to any of the digital data storage devices 1000-1 to 1000-N.

The optical components of the system 100 may be formed conventionally, e.g. as planar structures formed over a silicon substrate, e.g. a silicon wafer. A convenient platform on which to form the system 100 is a silicon-on-insulator (SOI) wafer, but embodiments of the invention are not limited thereto. For example, a dielectric layer, e.g. plasma oxide, could be formed on any suitable substrate, and a silicon layer could be formed thereover by any suitable method. Other embodiments may use a substrate formed from, e.g. glass, sapphire or a compound semiconductor. Those skilled in the pertinent art are familiar with such fabrication techniques.

In some embodiments optical and electrical components of the system 100 are formed on a same substrate. In such a system, e.g. silicon-based electronic components may be formed on one region of a photonic integrated circuit (PIC), and optical components may be formed on another region of the PIC. Interconnects may provide conductive paths from the domain converters 300 to the electrical switching stage 110.

In other embodiments, such as represented by FIG. 6A, portions of an opto-electronic system may be formed on separate substrates. FIG. 6A illustrates a system 600, formed according to one embodiment. Electrical components are formed on an electrically active substrate 610, optical components are formed on an optical substrate 620, and interconnects are formed on an interconnect substrate 630. The substrates 610, 620 and 630 are then joined to form the operable system 600.

The electronic substrate 610 may include electronic components, e.g. transistors, diodes, resistors and capacitors, needed to implement electrical functions of the system 100. Such functions include, but are not limited to, the switch 140 and the controller 145, including switching, signal conditioning and amplification. The electronic substrate 610 may include a base layer 640, e.g. a silicon wafer, and an active layer 650 that includes electronic devices and interconnects. The substrate 610 may be formed from any conventional and/or future-discovered processes, and is not limited to any particular material types. By way of example, without limitation, such materials may include silica, SiN, silicon, InP, GaAs, and copper or aluminum interconnects.

The optical substrate 620 includes various optical components of the system 100, e.g. waveguides, microcavity resonators, power splitters, power combiners, and photodiodes. The optical components may be formed from planar or ridge structures by conventional and/or novel processes. Such components typically include a core region and a cladding region. The core regions may be formed from any conventional or nonconventional optical material system, e.g. silicon, LiNbO$_3$, a compound semiconductor such as GaAs or InP, or an electro-optic polymer. Some embodiments described herein are implemented in Si as a nonlimiting example. While embodiments within the scope of the invention are not limited to Si, this material provides some benefits relative to other material systems, e.g. relatively low cost and well-developed manufacturing infrastructure. The cladding region may include homogenous or heterogeneous dielectric materials, e.g. silica or benzocyclobutene (BCB). Some portions of the cladding region may include air, which for the purposes of this discussion includes vacuum.

The interconnect substrate 630 includes additional interconnect structures that may configure operation of the system 600. The interconnect substrate 630 may include any dielectric and conductive (e.g. metallic) materials needed to implement the desired connectivity. In some cases, formation of the substrate 630 may include the use of a handle wafer to provide mechanical support, after which the substrate 630 is removed from the handle.

The electronic substrate 610 may be joined to the interconnect substrate 630 by, e.g. a bump process or, as illustrated, a wafer bonding process. Such processes are well known to those skilled in, e.g. semiconductor manufacturing, and may include chemical mechanical polishing (CMP) to prepare the substrate surfaces for bonding. The interconnect substrate 630 may be joined to the optical substrate 620 by, e.g. a bump process as illustrated in FIG. 6A, or a wafer bonding process as illustrated in FIG. 6B. In the bump process, solder balls 660 join interconnect structures in the substrate 630 to via structures 670 in the optical substrate 620. The via structures 670 may provide electrical and/or mechanical connectivity between substrates 620 and 630.

FIG. 6C illustrates another embodiment of the system 600 in which the interconnections and optical functions are combined into an integrated substrate 680. In the illustrated embodiment the substrate 680 includes the optical substrate 620 and interconnect layers 630a and 630b formed on either side of the substrate 620. The integrated substrate 680 may then be joined to the electrical substrate 610 by, e.g. wafer bonding.

The separate formation of the electronic substrate 610, the interconnect substrate 630 and the optical substrate 620 may serve at least one of several purposes. First, the thermal budget required to form some features, e.g. high quality waveguides in the optical substrate 620, may be incompatible with other features, such as doping profiles of transistors in the substrate 610. Second, the substrates 610, 620 and 630 may be formed separately by entities with specialized skills and/or fabrication facilities and joined by another entity. Third, where security is desired regarding the function of the assembled system 600, the fabrication operations may be assigned to the various entities such that no one entity acquires sufficient knowledge to determine the functionality of the device. The final assembly may then be completed under secure conditions to provide confidentiality of the operation of the assembled system 600.

Turning to FIG. 7, a method 700 is presented, e.g. for forming the system 100 according to various embodiments. The steps of the method 700 are described without limitation by reference to elements previously described herein, e.g. in FIGS. 1-6. The steps of the method 700 may be performed in another order than the illustrated order, and in some embodiments may be omitted altogether and/or performed concurrently or in parallel groups. This method 700 is illustrated without limitation with the steps thereof being performed in parallel fashion, such as by concurrent processing on a common substrate. Other embodiments, e.g. those utilizing multiple substrates, may perform the steps partially or completely sequentially and in any order.

The method 700 begins with an entry 710. In a step 720, a first input waveguide, e.g. the input waveguide 120-1, is formed. This waveguide is configured to receive a first input optical signal including a first modulated input wavelength channel. In a step 730, a first output waveguide, e.g. the waveguide 165-1, is formed. This waveguide is configured to receive a carrier signal including an unmodulated output wavelength channel. In a step 740 a first input microcavity resonator, e.g. the ring resonator 130-11, is formed. The ring resonator is configured to derive a modulated electrical control signal from the modulated input wavelength channel, e.g. by transferring optical power to the domain converter 300. In a step 750, a first output microcavity resonator is formed, e.g. the ring resonator 180-11. This microcavity resonator is configured to modulate said output wavelength channel in response to said control signal.

FIG. 8 presents another method 800, e.g. for forming the system 100. The steps of the method 800 are described without limitation by reference to elements previously described herein, e.g. in FIGS. 1-6. The steps of the method 800 may be performed in another order than the illustrated order, and in some embodiments may be omitted altogether and/or performed in parallel or in parallel groups. Herein and in the claims, "provided" or "providing" means that a device, substrate, structural element, etc., may be manufactured by the individual or business entity performing the disclosed method, or obtained thereby from a source other than the individual or entity, including another individual or business entity.

The method includes a step 810, in which a first substrate is provided, e.g. the substrate 620. The substrate includes an input waveguide, e.g. the waveguide 120-1, and an output waveguide, e.g. the waveguide 165-1. An input microcavity resonator, e.g. the resonator 130-11, is configured to derive a modulated electrical control signal from a modulated input wavelength channel propagating within the input waveguide. An output microcavity resonator, e.g. the resonator 175-11, is configured to modulate an output wavelength channel propagating within the output waveguide in response to the control signal.

In a step 820 a second substrate is provided, e.g. the substrate 610. The second substrate includes a control stage formed thereover, e.g. the electrical switching stage 110. The control stage is configured to route the electrical control signal from the input microcavity resonator to the output microcavity resonator.

In a step 830 the first and second substrates are joined, thereby connecting the control stage to the microcavity resonators.

In some embodiments of the method 800 joining the first and second substrates includes joining both substrates to a third substrate that includes conductive interconnections that connect the controller to the output microcavity resonator.

Those skilled in the art to which this application relates will appreciate that other and further additions, deletions, substitutions and modifications may be made to the described embodiments.

What is claimed is:

1. A system, comprising
a first input waveguide located on a first substrate and configured to receive a first input optical signal including a plurality of modulated input wavelength channels;
a first output waveguide located on said first substrate and configured to receive a carrier signal including a plurality of unmodulated output wavelength channels;
a plurality of input microcavity resonators each configured to derive a corresponding modulated electrical control signal from a corresponding one of said modulated input wavelength channels;
a plurality of output microcavity resonators each configured to modulate a corresponding one of said output wavelength channels in response to said control signal; and
a controller located on a second substrate and configured to reconfigure connectivity between said input microcavity resonators and said output microcavity resonators.

2. The system of claim 1, wherein said controller includes a cross-connect switch configured to provide a plurality of unique combinations of paths of said control signals between said input microcavity resonators and said output microcavity resonators.

3. The system of claim 2, wherein said cross-connect switch has N inputs and N outputs, and includes a plurality of sub-switches each being configured to switch $\sqrt{N}$ inputs to $\sqrt{N}$ outputs.

4. The system of claim 1, wherein said first and second substrates are both bonded to an interposed interconnect substrate.

5. The system of claim 1, wherein said microcavity resonators comprise ring resonators.

6. The system of claim 1, wherein one of said input wavelength channels employs the same wavelength as one of said output wavelength channels.

7. The system of claim 1, further comprising an optical source configured to produce said carrier signal.

8. The system of claim 7, wherein said optical source is configured to produce a plurality of wavelength components in the optical S, C, or L bands.

9. A method, comprising
forming a first input waveguide located on a first substrate and capable of receiving a first input optical signal including a plurality of modulated input wavelength channels;
forming a first output waveguide located on said first substrate and capable of receiving a carrier signal including a plurality of unmodulated output wavelength channels;
forming a plurality of input microcavity resonators each configured to derive a corresponding modulated electrical control signal from a corresponding one of said modulated input wavelength channels;
forming a plurality of output microcavity resonators each configured to modulate a corresponding one of said output wavelength channels in response to said control signal; and
forming a controller located on a second substrate and configured to reconfigure connectivity between said input microcavity resonators and said output microcavity resonators.

10. The method of claim 9, wherein said controller includes a cross-connect switch configured to provide a plurality of combinations of paths of said control signals between said input microcavity resonators and said output microcavity resonators.

11. The method of claim 10, wherein said cross-connect switch has N inputs and N outputs, and includes a plurality of sub-switches each being configured to switch $\sqrt{N}$ inputs to $\sqrt{N}$ outputs.

12. The method of claim 9, further comprising connecting said first and second substrates via an interposing interconnect substrate.

13. The method of claim 9, wherein said microcavity resonators comprise ring resonators.

14. The method of claim 9, wherein one of said input wavelength channels employs the same wavelength as channel and one of said output wavelength channels channel each employ a same wavelength.

15. The method of claim 9, further comprising configuring an optical source to produce said carrier signal.

16. The method of claim 15, wherein said optical source is configured to produce a plurality of wavelength components in the optical S, C, or L bands.

* * * * *